SEMICONDUCTOR DIODE PROTECTION

Filed Oct. 27, 1958 2 Sheets-Sheet 1

Inventor:

Erwin Salzer

Oct. 24, 1961 E. SALZER 3,005,945

SEMICONDUCTOR DIODE PROTECTION

Filed Oct. 27, 1958 2 Sheets-Sheet 2

Inventor:

Erwin Salzer

United States Patent Office 3,005,945

Patented Oct. 24, 1961

3,005,945
SEMICONDUCTOR DIODE PROTECTION

Erwin Salzer, Waban, Mass., assignor to The Chase-Shawmut Company, Newburyport, Mass.

Filed Oct. 27, 1958, Ser. No. 769,691
10 Claims. (Cl. 321—11)

This invention relates to semiconductor rectifiers as, for instance, semiconductor rectifiers comprising silicon diodes, germanium diodes, or other semiconductor diodes which are likely to be damaged or destroyed by relatively small overcurrents.

It is a general object of this invention to provide improved self-protected semiconductor rectifiers.

It is possible to design current-limiting fuses which may beconsidered to be fair thermal images of semiconductor diodes, or semiconductor cells, in combination with which the particular fuses are intended to be applied. Such fuses may either be designed to preclude damage to a diode, or may be designed to interrupt any fault or short-circuit current resulting from breakdown of a diode. It is possible to achieve a relatively close match between the time-current curves, or blowing characteristics, of current-limiting fuses and of the danger characteristics, or damage characteristics, of semiconductor rectifier cells, as long as the voltage for which the particular rectifier and its constituent parts are designed is relatively low. It has, however, not been possible heretofore to achieve the aforementioned match where the particular rectifier is designed for a relatively high voltage.

It is, therefore, another object of the invention to provide self-protected semiconductor rectifiers wherein a better match between the time-current-curve of current-limiting fuses and the danger or damage characteristic of semiconductor cells is being achieved than could be achieved heretofore in semiconductor rectifiers designed for relatively high circuit voltages, say circuit voltages in the order of, or exceeding, many hundred volts.

Current-limiting fuses in semiconductor rectifiers may either be required to blow in order to preclude an impending cell failure, or to blow in response to failure of a cell. Such fuses may be referred to as cell fuses in order to distinguish this application of fuses in semiconductor rectifiers from their application as a means of protection against over-currents resulting from external faults. This invention is more particularly concerned with the application of cell fuses.

Any increase of the circuit voltage calls for an increase of the length of the fusible elements in the cell fuses. Any increase in length of the fusible elements in the cell fuses changes, in turn, the time-current curves thereof. This upsets the match which may have been present between the time-current curve of the cell fuses and the danger characteristic, or damage characteristic, of the semiconductor cells or diodes.

It is, therefore, another object of the invention to provide semiconductor rectifiers for relatively high voltages comprising cell fuses having fusible elements of adequate length, i.e. fusible elements which are relatively long, in which rectifiers the time-current curve of the cell fuses matches well with the danger characteristic, or damage characteristic, of the rectifier cells.

Another object of the invention is to provide improved semiconductor rectifiers having current-limiting cell fuses which are being cooled by systems of cooling fins.

Heretofore cooling of fuse structures by systems of cooling fins has not been fully understood. To be more specific, heretofore cooling fins have been provided on the knife blades of fuses in an endeavor to achieve cool running fuse structures rather than for the purpose of matching the time-current curve of fuses with the danger characteristic, or damage characteristic, or other devices.

It is, therefore, another object of the invention to provide semiconductor rectifiers for relatively high voltages the cell fuses of which are cooled by systems of cooling fins designed to achieve a match between the time-current curve of the fuses and the danger characteristic, or damage characteristic, of the rectifier cells.

Prior art systems of fuse cooling fins, though well serving the ends for which they are intended, are not sufficiently effective for use in semiconductor rectifiers. The relative ineffectiveness of prior art systems of fuse cooling fins is due to the relatively high thermal impedance between the axially outer ends of the fusible elements and the heat dissipating fin structure, which impedance limits the flow of heat from the former to the latter.

It is, therefore, another object of the invention to provide fin-cooled fuse structures of drastically reduced thermal impedance.

The foregoing and other general and special objects of the invention and advantages thereof will more clearly appear from the particular description thereof, as illustrated in the drawings, wherein FIG. 1 is a wiring diagram of a self-protected semiconductor rectifier;

Figures 1, 2, 3, 3A:
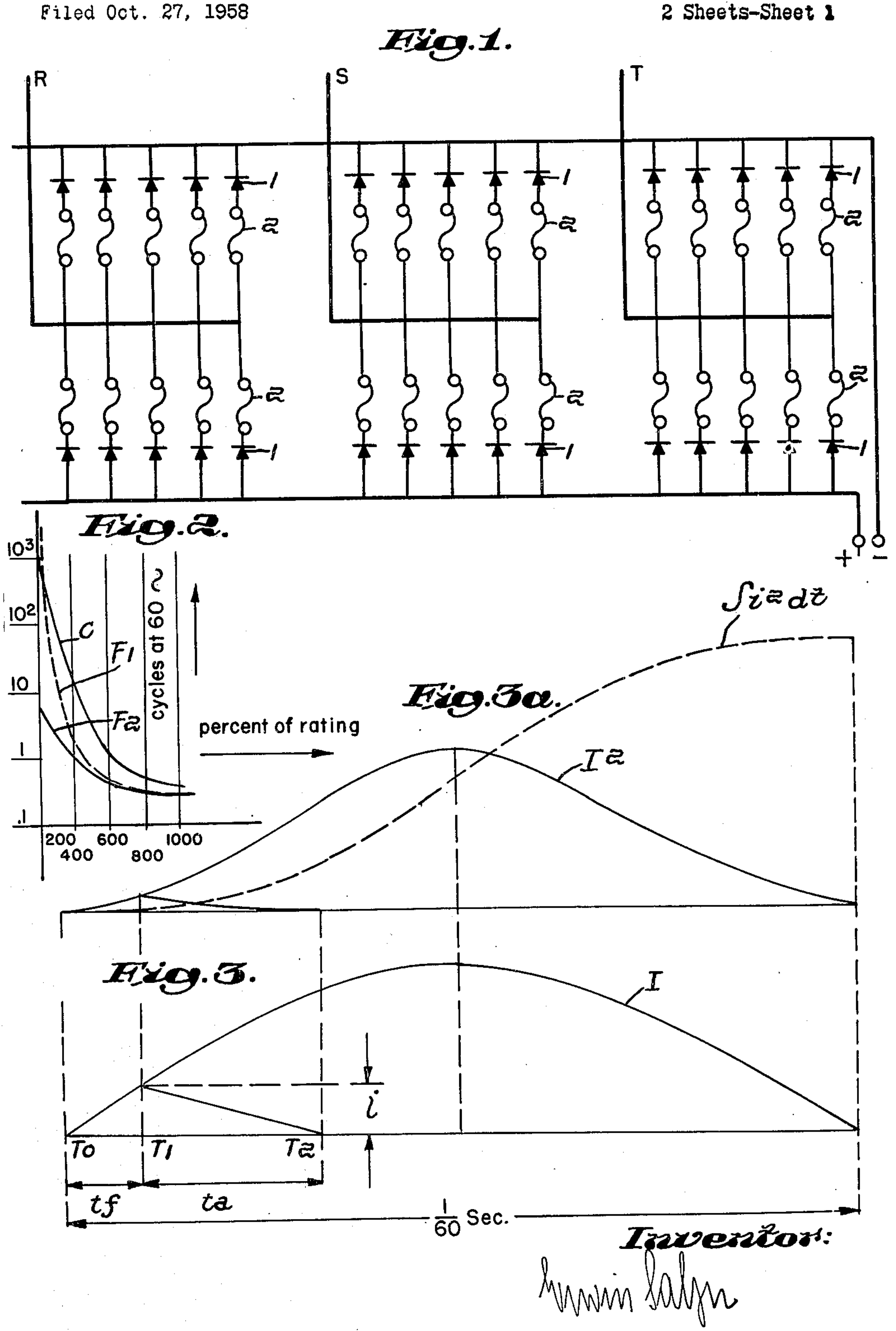
FIG. 2 is a diagram illustrating matching of cell and fuse characteristics by intense cooling action.
FIG. 3 is a diagrammatic representation of a fault current.
Figures 4, 5, 6, 7, 8, 9:
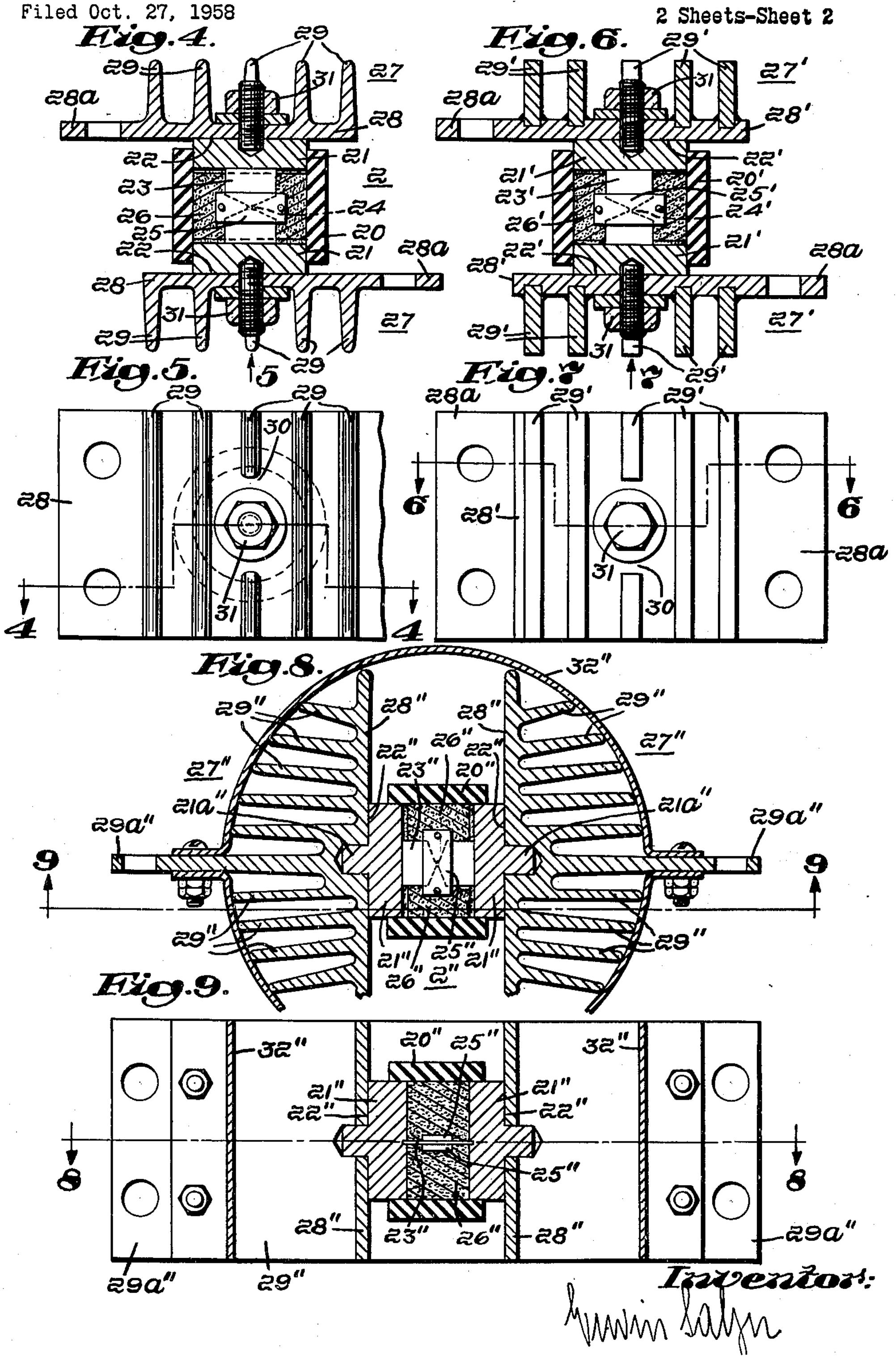

FIG. 3*a* is a diagrammatic representation of data derived from those plotted in FIG. 3;

FIG. 4 shows a fin-cooled cell fuse structure embodying the invention and is a section along 4—4 of FIG. 5;

FIG. 5 shows the same structure as FIG. 4 and is a front view seen in the direction of the arrow 5 in FIG. 4;

FIG. 6 shows a modification of the structure of FIGS. 4 and 5 and is a section along 6—6 of FIG. 7;

FIG. 7 shows the same structure as FIG. 6 and is a front view seen in the direction of the arrow 7 in FIG. 6;

FIG. 8 shows another embodiment of the invention and is a section along 8—8 of FIG. 9, and FIG. 9 shows the same structure as FIG. 8 and is a section along 9—9 of FIG. 8.

Referring now to the drawings, and more particularly to FIG. 1 thereof illustrating a three phase semiconductor bridge rectifier, numeral 1 has been applied to indicate the semiconductor rectifier cells and numeral 2 to indicate current-limiting cell fuses of which each is associated, and serially connected, with one of cells 1. Reference characters R, S, T have been applied to indicate three A.-C. leads and +, — have been applied to indicate the two D.-C. bus bars to which any desired D.-C. load may be connected.

In FIG. 2 currents have been plotted as abscissae in percent of cell rating and times have been plotted as ordinates in terms of cycles at 60 per sec. Both the abscissae, and the ordinates are drawn on logarithmic scales. Reference character C has been applied to indicate the danger characteristic, or damage characteristic, of one of cells 1 of FIG. 1. A danger characteristic is based on currents which cause a permanent incurable change to a cell structure, and a damage characteristic is based on currents which cause immediate damage to a cell structure. Reference character $F_1$ has been applied to indicate a time-current curve of a current-limiting cell fuse considered to fairly match curve C, except in the range of relatively small currents.

Assuming now that the system voltage is being increased requiring substitution of a plurality of serially related cells for each cell 1 of FIG. 1. This calls for substitution of the current-limiting fuses by cell fuses having fusible elements of increased length. Increase of the length of the fusible elements results in a change of the time-current curve relating to currents causing fusing of the fusible element or blowing of the fuse in times more than one cycle of a current wave of 60 c.p.s. or, in other words, relating to currents in the range of small overcurrents, say overcurrents of less than 300–500 percent of the rated current of cells 1. This changed characteristic has been indicated by a curve to which reference character $F_2$ has been applied. It is thus apparent that something must be done to the fuse to bring the shape of its time-current curve $F_2$ substantially back to its original shape, i.e. the shape of curve $F_1$ without, however, shortening the length of the link. Such a change of characteristic can be achieved by intense convection cooling, preferably forced convection cooling.

For a better understanding of the degree of convection cooling required for current-limiting cell fuses in a semiconductor rectifier reference may be had to FIGS. 3 and 3*a*. In FIG. 3 reference numeral I has been applied to indicate the current trace of a fault current caused by a cell failure which would develop in the absence of fuses 2, or if fuses 2 were shunted by shunts whose impedance were zero. In the presence of fuses 2 and the absence of such shunts the fusible element or elements of the fuse 2 serially connected with a faulted cell 1 fuses or melts at the time $T_1$ and the current begins to decay at the time $T_1$ and becomes zero at the time $T_2$. The time interval $T_0$–$T_1$ or $t_f$ is known as the fusing or pre-arcing time, and the time interval $T_1$–$T_2$ or $t_a$ is known as the arcing time. The total time $T_0$–$T_2$ or $t_f$ plus $t_a$ is referred to as the clearing time. The current which flows actually through the current-limiting fuse is considerably smaller than the available current I and is referred-to as the let-through current. The let-through current is much shorter than ½ cycle of a current wave in the 60 c.p.s. A.-C. system R, S, T (see FIG. 1), and its peak value indicated by reference letter *i* is much less than the peak value of the available current I.

In FIG. 3*a* reference letter $I^2$ has been applied to indicate a curve arrived at by plotting the squares of the momentary values of curves I. In the same figure $$\int i^2 \cdot dt$$

has been applied to indicate a curve obtained by integrating the momentary values of curve $I^2$. FIG. 3*a* shows also the squares of the let-through current. The scale in which FIG. 3*a* has been drawn is too small to show therein the curve which may be obtained by integrating the momentary values of the squares of the let-through current. The integral of the squares of the let-through current for the interval $T_0$–$T_1$ is known as the fusing $$\int i^2 \cdot dt$$

Considering short fusing times, say times less than .01 sec., the fusing $\int i^2 \cdot dt$ is a constant for any given fuse structure. There is a critical short-time damage or danger $\int i^2 \cdot dt$ for each type of rectifier cell which is likewise a constant considering short times, say times less than approximately .01 sec. (See F. E. Gentry, "Forward Current Surge Failure in Semiconductor Rectifiers," AIEE Transaction Paper No. 58–927.) The integral of the squares of the let-through current for the interval $T_0$–$T_2$ is known as the clearing $\int i^2 \cdot dt$. For practical purposes the clearing $\int i^2 \cdot dt$ may be approximated by multiplying the short-time fusing $\int i^2 \cdot dt$ by three. (See F. W. Gutzwiller "The Current-Limiting Fuse as Fault Protection for Semiconductor Rectifiers," AIEE Transaction Paper No. 58–928.)

In an arrangement such as the bridge circuit shown in FIG. 1 a predetermined current rating is assigned to each rectifier cell. The particular current rating depends not only upon the particular design of the cell but also upon the design of the rectifier, i.e. on both its electrical and its thermal parameters. Each cell 1 has also a predetermined danger or damage $\int i^2 \cdot dt$ which, at short times, say of less than .01 sec., is a design constant, as mentioned above. The cell fuses 2 which are arranged in series with cells 1 have, according to this invention, normally a smaller current rating than that assigned to cells 1 in the particular rectifier. The time-current curve $F_2$ in FIG. 2 is that of a fuse having normally a much smaller current rating than that of the rectifier cells whose danger or damage characteristic has been indicated by C.

For reasons of selectivity fuses 2 are designed to have a smaller short-time fusing $\int i^2 \cdot dt$ than the aforementioned short-time danger $\int i^2 \cdot dt$ of cells 1. Preferably the short-time clearing $\int i^2 \cdot dt$ of fuses 2 should be less than the danger $\int i^2 \cdot dt$ of cells 1.

Fuses 2 are associated with systems of cooling fins having a sufficiently large heat dissipating ability to cause an increase of the normal current rating of fuses 2 to approximately the current rating of cells 1 in the particular rectifier. In order to make it possible to significantly up-rate cell fuses 2, as required if these fuses are relatively long and designed for relatively high voltages, the thermal impedance of the fuses, i.e. their impedance to heat flow from the fusible element to the cooling fins, must be minimized. FIGS. 4–9 show several structures designed to minimize the aforementioned thermal impedance.

Referring now to FIGS. 4 and 5, numeral 2 has been applied to generally indicate a current-limiting cell fuse. Fuse 2 comprises a tubular casing 20 of insulating material closed on both ends by copper plugs 21. Each plug 21 projects with its axially outer surface 22 slightly beyond casing 20. The axially inner surfaces of plugs 21 are each provided with a groove receiving a fusible element 23 in form of a silver ribbon. Fusible element 23 is provided with a pair of lateral incisions defining therebetween a point 24 of reduced cross-section. The point 24 of reduced cross-section is sandwiched between a pair of plates 25 of a heat resistant synthetic-resin-glass-cloth laminate. Casing 20 is filled with a pulverulent filler 26 of silicon dioxide, e.g., quartz sand. Plates 25 form a fulgurite suppressing arc-chute separating filler 26 from the point of reduced cross-section 24. The mode of operation of such fulgurite suppressing or inhibiting arc chutes and desirable structural features thereof have been more fully disclosed in the patent application of Frederick J. Kozacka Ser. No. 658,162 filed May 9, 1957, for Current Limiting Fuses With Increased Interrupting Capacity, now United States Patent 2,866,038, and reference may be had to that patent for further details in regard to structure 25.

Current-limiting fuse 2 is cooled by two systems of cooling fins generally indicated by numeral 27. Each system 27 of cooling fins is formed by a casting comprising a substantially fin-shaped base plate 28 and spaced fins 29 projecting therefrom at right angles. Base plates 28 are each provided with a lug 28*a* forming a cable connector for inserting current-limiting fuse 2 into the circuit of one of cells 1. (See FIG. 1.) The fin 29 situated in the center of each plate 28 defines a gap 30 adapted to accommodate a screw 31. Screws 31 project transversely across plates 28 into plugs 21 and establish firm electrical contacts between plates 28 and plugs 21. Plugs 21 and plates 28 form means for conducting heat from fuse link 23 to the system of cooling fins 27. These heat conducting means have a cross-sectional area being at no point less than the cross-sectional area of the inside of casing 20. Because of that large area of heat exchange between fuse link or fusible element 23 and the cooling fins 29 the latter are highly effective and allow the use, in series with semiconductor cells 1, of cell fuses 2 which have normally a much smaller current-rating than cells 1 and which have normally a time-current characteristic which differs in the range of currents less than 300–500% the current rating of cell - drastically from the danger or damage characteristic of cell 1.

The time current curve of cell fuses 2 in the range of more than 300–500% the current rating of cells 1, i.e., the right portion of the time-current curve referring to blowing in about 1 cycle or less of a current wave of 60 c.p.s. is primarily, or exclusively, determined by the dimensions of reduced cross-section portion 24. This portion, i.e., the high current portion, of the time-current characteristic is not significantly affected by the length of link 23.

The structure of FIGS. 6 and 7 is essentially the same as the structure of FIGS. 4 and 5. The former distinguishes from the latter merely by reason of the fact that the fin cooling systems for the fuse are fabricated units rather than castings. In FIGS. 6 and 7 the parts corresponding to those of FIGS. 4 and 5 have been indicated by the same reference characters with a prime sign added.

Plates 28′ are each provided with a system of parallel grooves machined into them by a gang tool. Cooling fins 29′ are inserted into these grooves and secured to plates 28′ by brazing. FIGS. 6 and 7 do not call for an additional description on account of the substantial identity of the structure shown therein to that illustrated in FIGS. 4 and 5.

In FIGS. 8 and 9 the elements corresponding to those of FIGS. 4–7 have been indicated by the same reference characters with two prime signs added. Thus current limiting fuse 2″ is arranged in the space formed between a pair of parallel base plates 28″. Base plates 28″ are arranged at right angles to plugs 21″, i.e., the planes of plates 28″ are at right angles to the common longitudinal axis of plugs 21″. Plates 28″ are in immediate abutting engagement with the axially outer surfaces of plugs 21″. Thus a metallic path for the flow of heat from fuse link 23″ to the systems 27″ of cooling fins 29″ is established which has a minimum cross-sectional area equal to the cross-setcional area of the inside of casing 20″. The magnitude of the cross-sectional area of this path for the flow of heat from link 23″ to the systems 27″ of cooling fins 29″ is conducive to a very effective cooling of link 23″ permitting a drastic uprating of cell fuse 2″. Each plug 21″ is provided with a screw **21*a*″ screwed into one of plates 28″. The center fins 29″ form lugs 29*a*″ for connecting fuses 2″ into the circuit of a semiconductor rectifier cell. (Not shown in FIGS. 8 and 9.) The outer ends of fins 29″ are situated in a cylindrical plane and surrounded by a tube 32″** forming a duct for a blast of cooling medium such as, for instance, air under pressure.

Current-limiting cell fuses 2 for relatively high voltage ratings call for a pulverulent filler of silicon dioxide as, for instance, quartz sand. In standard current-limiting fuses the quartz sand forms upon blowing of the fuse an arc-gap-shunting fulgurite allowing, as long as hot, the flow of an arc-gap-shunting current known as follow current tending to increase the duration of the flow of the let-through current. This, in turn, tends to increase the clearing $\int i^2 \cdot dt$. The provision of plates 25, 25′ and 25″ inhibits formation of arc-gap-shunting fulgurites, and makes it readily possible to limit the clearing $\int i^2 \cdot dt$ to smaller values than the short-time danger or damage $\int i^2 \cdot dt$ of the serially connected rectifier cell.

While I have illustrated and described cell fuses having fusible elements in ribbon form with one single point of reduced cross-section approximating a point-heat-source when the fusible element is carrying an electric current, the invention is not limited to fuses with this type of fusible elements. Where the current rating of the semiconductor rectifier cells is small, the fusible element does not need to be in the form of a ribbon, though a very short and narrow neck-portion will always be required. As the general rule the current-carrying capacity of the semiconductor cell will call for a fusible element in the cell fuse which is in the form of a ribbon. Where the circuit voltage is relatively high, fusible ribbon elements of increased length having more than one single point of reduced cross-section may be required. This results in increased heat generation making it particularly desirable to resort to the small thermal impedance structures which have been described above, and to combine such structures with means for establishing a forced draft.

While in each of the embodiments of the invention illustrated and described each cell fuse is associated with two systems of cooling fins it may be sufficient, in certain instances, to provide each cell fuse with but one system of cooling fins, i.e. to omit the other system.

The wiring diagram of FIG. 1 shows one cell fuse associated with each semiconductor cell and a relatively large number of semiconductor cells connected in parallel. This makes it possible to maintain continuity of service when but one cell fails and but the fuse which is associated with that cell blows. It is, however, possible to reduce the number of cells connected in parallel and to provide one single cell fuse for more than one cell.

Base plates 28, 28′, 28″ operate largely also as cooling fins, i.e. these plates have a relatively large heat dissipating ability.

Where the short-time fusing $\int i^2 \cdot dt$ of the cell fuse is smaller than the short-time danger or damage $\int i^2 \cdot dt$ of the semiconductor cell, but the latter is smaller than the clearing $\int i^2 \cdot dt$ of the cell, the cell fuse can but clear the fault-current caused by cell failure, but cannot prevent impending failure of a cell. To achieve this end it is necessary to make the point 24, 24′, 24″ of restricted cross-section sufficiently small and the fulgurite suppressing insulating barrier 25, 25′, 25″ sufficiently effective to limit the short-time clearing $\int i^2 \cdot dt$ to smaller values than the short-time danger $\int i^2 \cdot dt$ of the cell to be protected.

The properties of characteristic C in FIG. 2 and the data derived therefrom are generally common to all high current density semiconductor cells, and are substantially a result of the fact that the mass of the active part of the cell is always relatively small, resulting in permanent cell damage at over-currents as small as 300–500 percent cell rating. Though the danger or damage characteristic of various types of high current density cells varies, it is fair to say that the cross-section of the point or points of restricted cross-section of the fusible element of any cell fuse intended to be used jointly with a high current density semiconductor cell must be sufficiently small to initiate fusion at said point in less than 1/60 sec. at the occurrence of currents more than 300 percent and not exceeding 500 percent of the current rating of the semiconductor diode.

This invention as described above is based on the following physical facts:

One important parameter of a semiconductor diode is its short-time danger or damage $\int i^2 \cdot dt$ which is a constant of any particular diode design. Another important parameter of a semiconductor diode is the current rating assigned to it when combined with any particular rectifier. In order to achieve a match of the characteristics of the cell fuse and the rectifier cell, the short-time fusing $\int i^2 \cdot dt$ of the fuse must be matched with danger or damage $\int i^2 \cdot dt$ of the cell and the fault current must be caused to rapidly decay to zero after having reached the fusing peak (designated by reference letter *i* in FIG. 3). The short-time fusing $\int i^2 \cdot dt$ of the cell fuse is a constant which depends on the kind of metal of which its fusible element is made, and upon the geometry, particularly the cross-sectional area, of the point or points of reduced cross-section 24, 24′, 24″. Thus the design of the point or points of reduced cross-section 24, 24′, 24″ is substantially determined by the quantity referred to as the danger or damage $\int i^2 \cdot dt$ of the semiconductor diode. The plates 25, 25′, 25″ or equivalent insulating barriers suppressing, or inhibiting, formation of arc-gap-shunting fulgurites are responsible for rapid current decay after the peak of the let-through current has been reached, thus enabling—if desired—to limit the clearing $\int i^2 \cdot dt$ to smaller values than the danger or damage $\int i^2 \cdot dt$ of the semiconductor diode. The design of the portion of the fusible element having the relatively large cross-sectional area determines the shape of the left portion of the time-current curve (FIG. 2) which, in turn, is determined by the rate of heat flow away from the neck portion 24, 24′, 24". Closely matching the left portion of the time-current curve of the cell fuse with the left portion of the cell's danger or damage characteristic C (FIG. 2) calls for a certain geometry of the relatively large cross-section portion of the fusible element and predetermines also the length thereof. The length of the fusible element is, however, also determined by the particular circuit voltage, or the voltage for which the rectifier and its components are designed. It is thus apparent that the length of the fusible element is determined by two requirements. These two requirements are compatible for small circuit voltages and become more and more incompatible as the circuit voltage is increased. Resorting to the highly effective cooling means which have been disclosed makes it possible to reconcile length requirements which, otherwise, may be contradictory or incompatible. To be more specific, according to this invention the length of the fusible element is being determined by voltage requirements only, without giving consideration to characteristic matching requirements; characteristic matching requirements are being complied with by the provision of simple and highly effective cooling means imparting substantially the same shape to the left portion of the time current curve $F_1$ (FIG. 2) of the cell fuse which it would have if its length were shorter and determined on the basis of characteristic matching requirements.

It will be understood that although but three embodiments of the invention have been illustrated and described in detail, the invention is not limited thereto. It will also be understood that the structures illustrated may be modified without departing from the spirit and scope of the invention as set forth in the accompanying claims.

I claim as my invention:

1. A semiconductor rectifier comprising an electric circuit, a semiconductor diode arranged in said circuit, a current-limiting cell fuse arranged in said circuit in series with said diode, said cell fuse including a casing having a predetermined cross-sectional area and a fusible element arranged in said casing, a system of spaced cooling fins for cooling said cell fuse, a common support for said system of cooling fins, metallic means for conducting heat from said fusible element to said common support of said system of cooling fins, and said metallic heat conducting means having a cross-sectional area being at no point of said metallic heat conducting means substantially less than said predetermined cross-sectional area of said casing.

2. A semiconductor rectifier comprising an electric circuit, a semiconductor diode arranged in said circuit, a current-limiting cell fuse arranged in said circuit in series with said diode, said cell fuse including a tubular insulating casing having a predetermined cross-sectional area, a pair of metal plugs each closing one end of said casing and each having an axially outer surface and ribbon fuse link means conductively interconnecting said pair of plugs, a system of spaced cooling fins for cooling said cell fuse, a base plate of metal supporting said system of cooling fins and forming an integral part thereof, said base plate being arranged at right angles to one of said pair of plugs and in abutting engagement with said axially outer surface thereof and establishing jointly with said one of said pair of plugs a metallic path for the flow of heat from said fuse link means to said system of cooling fins having a minimum cross-sectional area substantially equal to said predetermined cross-sectional area of said casing.

3. A semiconductor rectifier comprising an electric circuit, a semiconductor diode arranged in said circuit, a current-limiting cell fuse arranged in said circuit in series with said diode, said cell fuse including a tubular insulating casing having a predetermined cross-sectional area, a pair of metal plugs each closing one end of said casing, and fuse link means conductively interconnecting said pair of plugs, a pair of spaced systems of spaced cooling fins for cooling said cell fuse, a pair of base plates of metal each supporting one of said pair of systems of cooling fins and forming an integral part thereof, and each of said pair of base plates being arranged at right angles to one of said pair of plugs and in abutting engagement with an axially outer surface thereof and each of said pair of base plates establishing jointly with one of said pair of plugs a metallic path for the flow of heat from said fuse link means to one of said pair of systems of cooling fins.

4. A semiconductor rectifier comprising a semiconductor diode having a predetermined current rating under conditions prevailing in said rectifier and a predetermined short-time danger $\int i^2 \cdot dt$, a current-limiting cell fuse having a normal current rating substantially less than said predetermined current-rating of said diode and a predetermined short-time fusing $\int i^2 \cdot dt$, means for serially connecting said diode and said cell fuse into an electric circuit, said cell fuse comprising a tubular insulating casing, a fusible element in ribbon-form housed in said casing and having a point of restricted cross-section sufficiently small to limit said short-time fusing $\int i^2 \cdot dt$ to smaller values than said short-time danger $\int i^2 \cdot dt$, a pair of terminal plugs closing both ends of said casing, each of said pair of plugs having an axially outer surface and an axially inner surface conductively connected to said fusible element, a system of spaced cooling fins arranged adjacent one end of said casing of said cell fuse, a base plate of metal supporting said system of cooling fins and arranged at right angles to one of said pair of plugs and in abutting engagement with said axially outer surface thereof, said system of cooling fins having a sufficiently large heat dissipating ability to cause an increase of said normal current rating of said current-limiting fuse to substantially the same value as said current rating of said diode.

5. A semiconductor rectifier comprising a semiconductor diode having a predetermined current rating under conditions prevailing in said rectifier and a predetermined danger $\int i^2 \cdot dt$ at times less than .01 sec.; a current-limiting cell having a normal current rating substantially less than said predetermined current rating of said diode and a predetermined clearing $\int i^2 \cdot dt$ at times less than .01 sec.; means for serially connecting said diode and said cell fuse into an electric circuit; said cell fuse comprising a tubular casing, a filler of pulverulent silicon dioxide in said casing, a fusible element in ribbon-form submersed in said filler, said element having a point of restricted cross-section sufficiently small and being provided with fulgurite suppressing insulating barrier means sufficiently effective to limit said clearing $\int i^2 \cdot dt$ to smaller values than said danger $\int i^2 \cdot dt$, and a pair of metal plugs closing the ends of said casing and conductively interconnected by said fusible element; at least one system of spaced cooling fins adapted to cool said cell fuse to such an extent as to increase said normal current rating thereof to substantially the same value as said current rating of said diode; and a base plate of metal supporting said system of cooling fins and forming an integral part thereof arranged at right angles to one of said pair of plugs in abutting engagement with the axially outer surface thereof.

6. A semiconductor rectifier comprising a semiconductor diode having a predetermined current rating, a current-limiting cell fuse, means for serially connecting said diode and said cell fuse into an electric circuit, said cell fuse comprising a tubular casing having a predetermined cross-sectional area, a ribbon fuse link housed in said casing and having a point of restricted cross-section sufficiently small to initiate fusion at said point in less than $\frac{1}{60}$ sec. at the occurrence of currents of more than 300 percent but of less than 500 percent of said current rating of said diode, a pair of terminal plugs closing both ends of said casing conductively interconnected by said fuse link each having an axially outer surface projecting beyond said casing, and a plate of metal having one side arranged remote from one of said pair of plugs and provided on said one side with a plurality of spaced cooling fins, said plate having another side arranged in abutting relation with said axially outer surface of said one of said pair of plugs, and the area of physical engagement between said plate and said one of said pair of plugs being substantially equal to said predetermined cross-sectional area of said casing.

7. A semiconductor rectifier comprising a semiconductor diode having a predetermined current rating; a current-limiting cell fuse including a tubular insulating casing, a ribbon fuse link housed in said casing and having a point of restricted cross-section adapted to initiate fusion of said point in less than 1/60 sec. at currents of more than 300 percent but less than 500 percent of said rating of said diode, and a pair of metal plugs closing both ends of said casing each having an axially inner surface conductively connected to said link and an axially outer surface; a system of angularly arranged cooling fins adjacent one end of said casing, said system including one cooling fin abutting against the entire area of said axially outer surface of one of said pair of plugs and having a lug adapted to form an electric connector; and means for serially connecting said diode and said cell fuse into an electric circuit, said connecting means including said lug.

8. An arrangement for limiting the thermal impedance to heat flow away from the fusible elements of electric fuses comprising a tubular insulating casing, a pair of metallic terminals closing the ends of said casing, each of said pair of terminals having an axially inner surface and an axially outer surface, a fusible element arranged in said casing conductively interconnecting said pair of terminals, and a system of angularly arranged cooling fins adjacent one end of said casing, said system including one fin in abutting relation with substantially the entire area of said axially outer surface of one of said pair of terminals.

9. An arrangement for limiting the thermal impedance to heat flow away from the fusible element of electric fuses comprising a tubular insulating casing, a pair of metal plugs closing the ends of said casing, each of said pair of plugs having an axially inner surface and an axially outer surface, a fusible element in ribbon-form conductively interconnecting said pair of plugs, a cooling-fin-supporting metal plate arranged adjacent one end of said casing, said plate having an axially outer surface and supporting a plurality of spaced cooling fins projecting from said axially outer surface, and said plate having an axially inner surface arranged in abutting relation to the entire area of said axially outer surface of one of said pair of plugs.

10. An arrangement for limiting the thermal impedance to heat flow away from the fusible element of electric fuses comprising a tubular insulating casing, a pair of metallic terminals closing the ends of said casing, each of said pair of terminals having an axially inner surface and an axially outer surface, a fusible element arranged in said casing conductively interconnecting said pair of terminals, a cooling-fin-supporting metal plate arranged adjacent one end of said casing, said plate having an axially inner surface arranged in abutting relation to the entire area of said axially outer surface of one of said pair of terminals, and said plate having an axially outer surface provided with a plurality of spaced cooling fins angularly projecting therefrom, at least one of said plurality of cooling fins defining a fin-subdividing gap, and a clamping screw arranged in said gap projecting through said plate into one of said pair of terminals.

References Cited in the file of this patent

UNITED STATES PATENTS

| | | |
|---|---|---|
| 2,439,165 | Graves | Apr. 6, 1948 |
| 2,605,371 | Fahnoe | July 29, 1952 |
| 2,734,112 | Kozacka | Feb. 7, 1956 |
| 2,813,243 | Christian et al. | Nov. 12, 1957 |
| 2,871,314 | Swain et al. | Jan. 27, 1959 |